United States Patent
Hurt et al.

(10) Patent No.: US 7,792,426 B2
(45) Date of Patent: Sep. 7, 2010

(54) METHOD AND DEVICE FOR OPERATING AN OPTICAL TRANSMITTING DEVICE HAVING A PLURALITY OF OPTICAL TRANSMITTERS THAT CAN BE DRIVEN INDEPENDENTLY

(75) Inventors: Hans Hurt, Regensburg (DE); Thomas Lichtenegger, Alteglofsheim (DE); Gustav Müller, Osterhofen (DE); Joachim Pfeiffer, Feldkirchen (DE); Stephan Prucker, Burglengenfeld (DE); Karl Schrödinger, Berlin (DE); Gunther Steinle, München (DE); Josef Wittl, Parsberg (DE)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 1053 days.

(21) Appl. No.: 11/337,954

(22) Filed: Jan. 23, 2006

(65) Prior Publication Data

US 2006/0245753 A1    Nov. 2, 2006

(30) Foreign Application Priority Data

Jan. 26, 2005    (EP) .................. 05090021

(51) Int. Cl.
*H04B 10/08* (2006.01)

(52) U.S. Cl. .................. 398/38; 398/3; 398/5; 398/33; 398/94; 398/95; 398/196; 398/197; 250/205; 250/206; 250/214 R; 250/221

(58) Field of Classification Search .................. 398/182, 398/183, 186, 195, 192, 197, 202, 1, 5, 7, 398/10, 14, 15, 17, 22, 23, 25, 26, 27, 33, 398/38, 91, 94, 95, 196; 250/205, 551, 214 R, 250/221, 206
See application file for complete search history.

(56) References Cited

U.S. PATENT DOCUMENTS

| 4,403,139 | A | | 9/1983 | De Loach, Jr. |
| 4,696,060 | A | | 9/1987 | Oswald |
| 5,299,293 | A | * | 3/1994 | Mestdagh et al. ............. 398/24 |
| 6,204,493 | B1 | * | 3/2001 | Fischl et al. ................. 250/205 |
| 6,631,019 | B1 | * | 10/2003 | Vujkovic-Cvijin et al. .. 398/195 |
| 2004/0208650 | A1 | * | 10/2004 | Suzuki ........................ 398/195 |
| 2005/0191052 | A1 | * | 9/2005 | Schrodinger ................. 398/12 |
| 2005/0238361 | A1 | * | 10/2005 | Marmur et al. ............. 398/140 |

FOREIGN PATENT DOCUMENTS

EP    1 324 521 A1    7/2003

OTHER PUBLICATIONS

International Search Report, Int'l Application No. EP 05 09 0021, 2 pages, Jun. 20, 2005.

* cited by examiner

*Primary Examiner*—Hanh Phan

(57) ABSTRACT

The invention relates to a method and a device for operating an optical transmitting device having a plurality of optical transmitters that can be driven independently. The method includes detecting the parameter values of the individual transmitters, comparing the parameter values determined with one another and/or with a prescribed comparison value, and selecting one of the transmitters for the communication operation of the transmitting device based on the comparison. The method further includes operating the transmitting device with the selected transmitter.

22 Claims, 3 Drawing Sheets

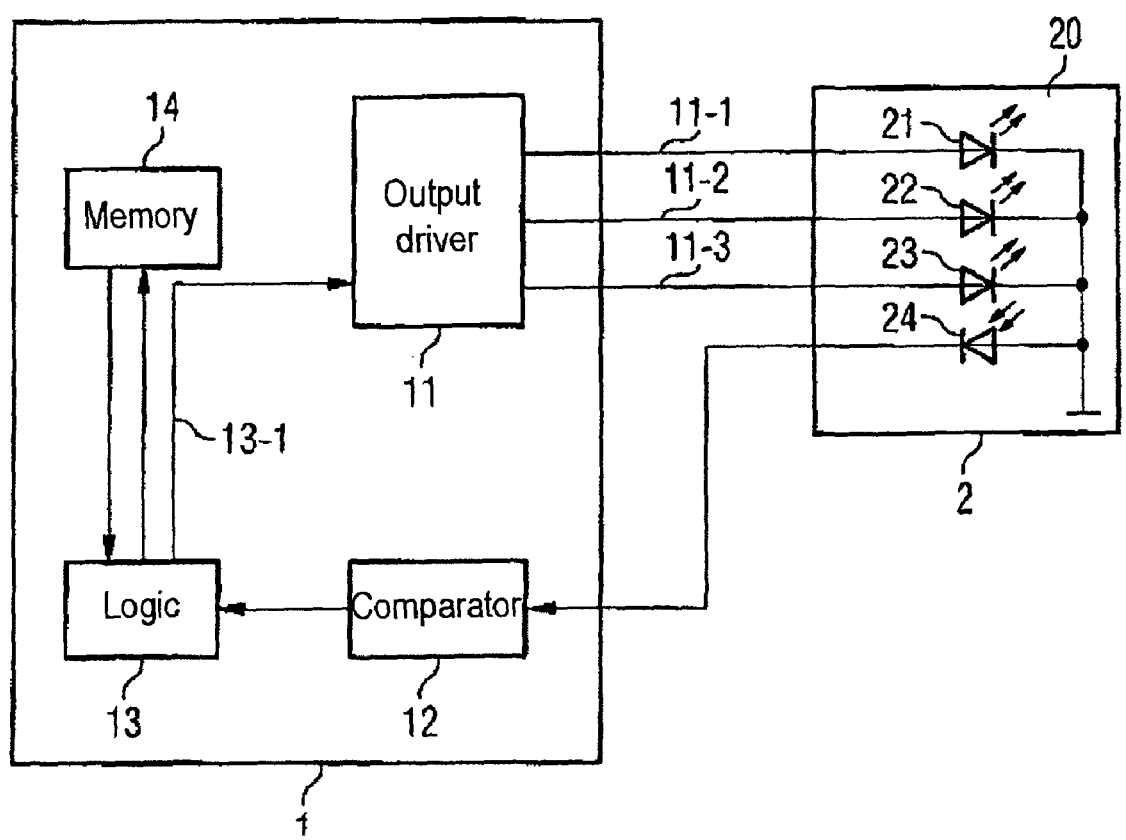

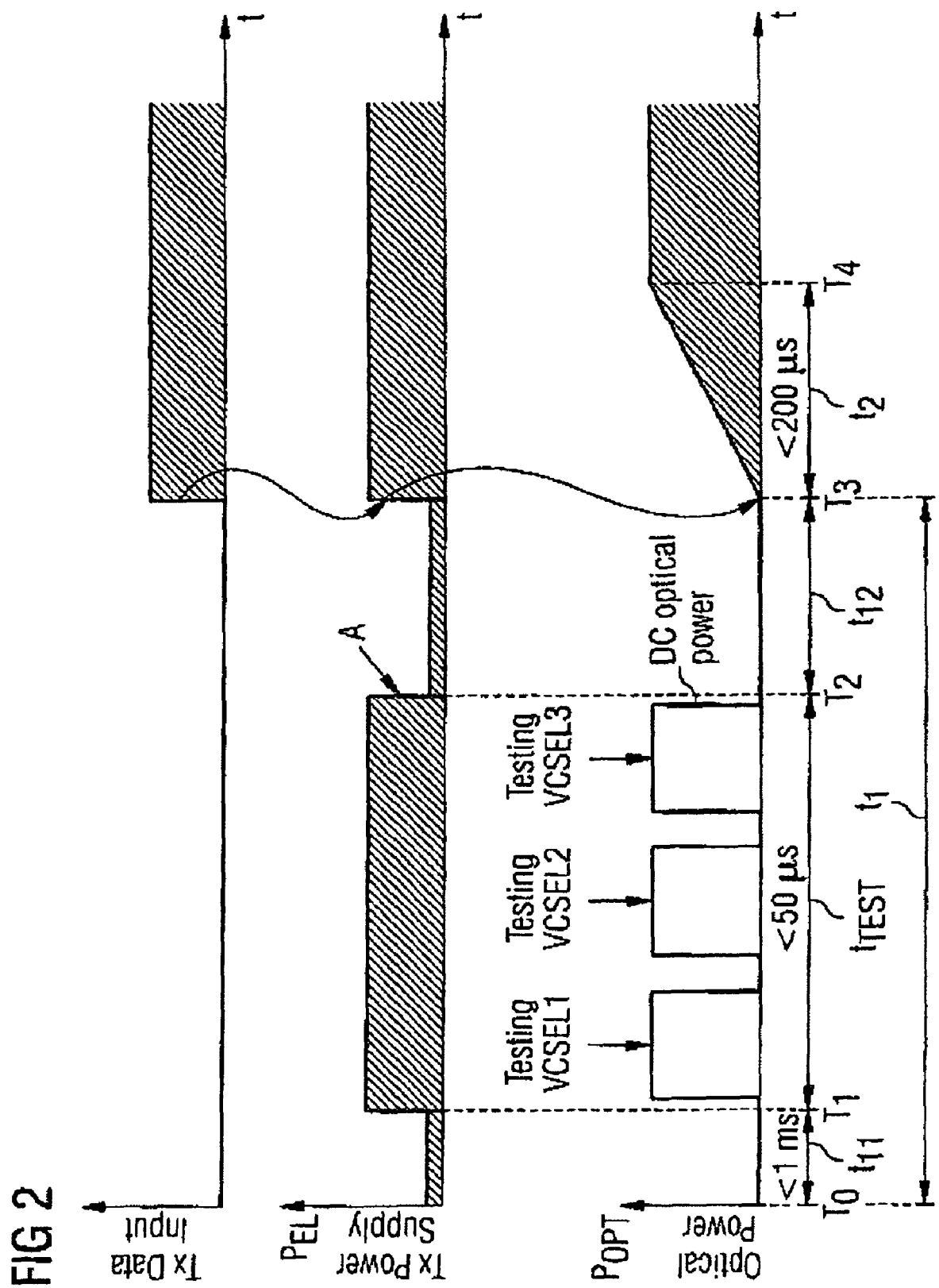

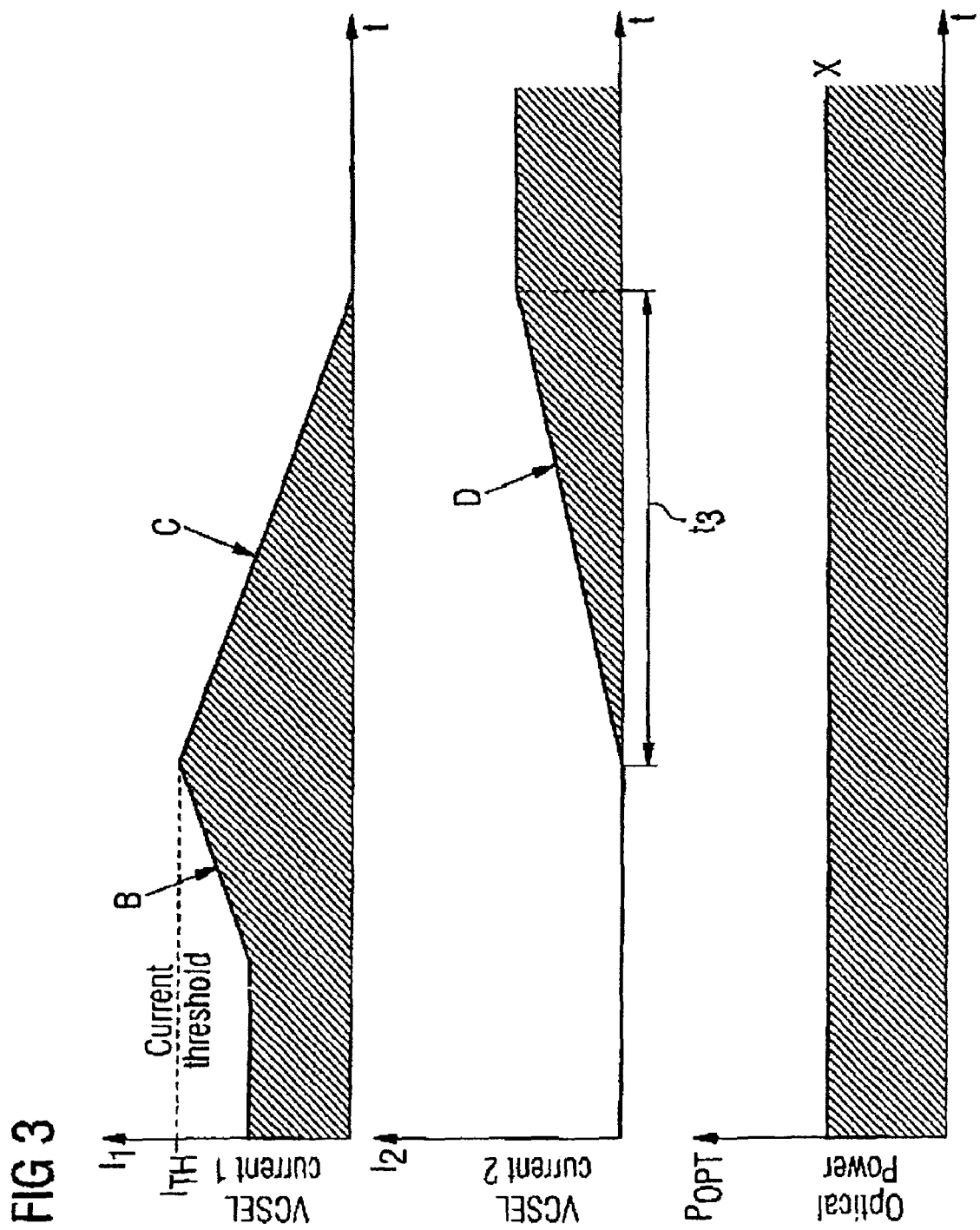

METHOD AND DEVICE FOR OPERATING AN OPTICAL TRANSMITTING DEVICE HAVING A PLURALITY OF OPTICAL TRANSMITTERS THAT CAN BE DRIVEN INDEPENDENTLY

REFERENCE TO RELATED APPLICATIONS

This application claims the benefit of the priority date of European application EP 05 090 021.6, filed on Jan. 26, 2005, the contents of which are herein incorporated by reference in their entirety.

FIELD OF THE INVENTION

The invention relates to a method and device for operating an optical transmitting device having a plurality of optical transmitters that can be driven independently. In particular, the invention relates to an intelligent selection of one of the transmitters of such an optical transmitting device for communication operation.

BACKGROUND OF THE INVENTION

Monolithic optoelectronic chips are known on which a plurality of laser diodes that can be driven independently of one another are realized. From the plurality of laser diodes, at a point in time under consideration, one of the laser diodes serves for data communication, while the others are kept as redundant laser diodes for the case where the laser diode currently being used fails or falls below prescribed quality criteria in particular with regard to the light power. Thus, the failure rate of laser diodes is 50 to 200 ppm, depending on the operating temperature. By using redundant transmitting sources, it is possible to reduce the failure rate of a transmitting device to less than 10 ppm.

If the laser diode currently being used fails or falls below prescribed quality criteria, a change is made to a different one of the laser diodes and this laser diode is used for data communication. The sequence of the laser diodes used is fixedly prescribed in this case. In this case, there is the risk of the replacement laser diode likewise falling below prescribed quality criteria.

It is furthermore known to use all the laser diodes of a chip having a plurality of laser diodes simultaneously for data communication, the same signal being emitted by the laser diodes. In the event of a failure of one of the laser diodes, the further data communication is effected using the remaining laser diodes. However, this solution has the disadvantage that the laser operation is effected with a high current consumption and a high temperature.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a method and a device for operating an optical transmitting device having a plurality of optical transmitters that can be driven independently that are distinguished by an intelligent selection of the transmitter currently being used.

Accordingly, the method includes detecting the parameter values of the individual detectors with respect to at least one parameter. The determined parameter values are compared with one another and/or with a prescribed comparison value. By way of example, the light powers of the individual light transmitters of the transmitting device are compared with one another or with a prescribed optimum light power value. One of the transmitters is subsequently selected for the communication operation of the transmitting device based on the comparison. By way of example, the light transmitter having the highest light power is selected for the communication operation. The transmitting device is then operated using the selected transmitter, while the other transmitters are kept as redundant transmitters.

It is pointed out that the operating method step does not have to follow the selecting method step directly in time, rather these steps may be separated temporarily.

In one example the detected parameter values or values derived therefrom are stored in a memory. In the case where the transmitter that is currently being used for the communication operation deviates from a prescribed criterion (e.g., whether the light power of the transmitter falls below a prescribed minimum value), a replacement transmitter is selected from the plurality of transmitters based on the stored values and is used for further communication operation. This makes it possible, in the event of failure of the present transmitter, not to use an arbitrary light transmitter whose parameter values are possibly only mediocre or poor, but rather to select that light transmitter which then best fulfils specific criteria, for example has the highest light power. Thus the next selected transmitter is that transmitter which fulfilled the prescribed criteria second best in the course of the measurement. In the event of a further failure, a change is made to the next best transmitter etc.

In one example, a "failure of a light transmitter" is understood to mean on the one hand the case where a light transmitter fails in the sense that it no longer emits light, but on the other hand also the case where a prescribed criterion is no longer fulfilled.

It is pointed out that a parameter is understood to mean a parameter of a laser diode, for example the light power or the operating temperature. A parameter value is the value of the parameter in the case of a measurement carried out at a specific point in time. However, a parameter value is also understood to mean a value which is derived from the actual parameter value and is in a defined relationship with the measured parameter value. Such a derived value is for example the current of a monitor diode that detects a specific part of the light emitted by the light transmitter, while the light power is the actual parameter value. The current of the monitor diode represents the light power, for which reason it is likewise regarded as a parameter value in the sense of the invention. In particular, it is unimportant whether the actual parameter values or values derived therefrom are compared with one another and stored in the memory. Derived values may also be an order in which the transmitters are to be operated, and such parameters are contemplated as falling within the scope of the present invention.

In one example, it is provided that the transmitter used for the communication operation is changed by reducing the light conduction of the previously used transmitter and simultaneously increasing the light power of the newly selected transmitter, wherein both emit light during a transition time. A slow change is present, which prevents the previous transmitting source from being changed over abruptly and data from being lost during the changeover.

In a further example, the detecting, comparing and selecting steps are carried out in a start phase of the transmitting device. The steps are carried out in each start phase, that is to say in the event of each restart, so that the present parameter values are always available. In this case, the parameter values previously stored in the memory are overwritten by the parameter values that are currently detected during the renewed start phase.

As an alternative embodiment, however, it may also be provided that the detecting, comparing and selecting steps are carried out at the end of the production of the transmitting device (end-of-line test), and the information regarding which of the transmitters is to be used initially for communication operation and the order in which further transmitters from among said transmitters are available as replacement transmitters, is stored in a non-volatile memory. The order in which the light transmitters are to be used is thus defined by a test at the end of production and stored in non-volatile fashion. The corresponding non-volatile memory is integrated for example in the transmitting device.

In another embodiment of the invention, the transmitters are driven sequentially for the purpose of detecting the light power and the light detector detects part of the emitted light of the transmitter respectively driven. This makes it possible to use only one light detector for determining the parameter values of all the transmitters. As an alternative, each transmitter is assigned a separate monitor diode which detects the light power of a respective transmitter. The light powers can then be detected in parallel.

Furthermore, in one example an inhibit flag is set for a transmitter in the case of which the parameter value determined deviates from an ideal value by more than a prescribed tolerance value, wherein the inhibit flag inhibits the corresponding transmitter for communication operation.

In one embodiment of the invention, an optical transmitting device comprises an output driver for driving the optical transmitters independently of one another, and a comparator, which compares parameter values with one another and/or with a reference value which are currently detected with respect to at least one parameter of the transmitters from each transmitter. The device further comprises a control device connected to the comparator. The control device, based on the comparison carried out by the comparator, passes control commands to the output driver to operate a specific one of the plurality of transmitters.

The control device is preferably connected to a memory, in which the parameter values determined or values derived therefrom are stored.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in more detail below using an exemplary embodiment with reference to the figures, in which:

FIG. 1 is a block/schematic diagram illustrating a device for operating an optical transmitting device having a plurality of optical transmitters according to the invention;

FIG. 2 is a series of graphs illustrating the optical power of the transmitting device, the electrical power supply of the transmitting device and a data transmission of the transmitting device, in each case as a function of time; and FIG. 3 is a series of graphs illustrating the optical power of the transmitting device, the current through a first transmitter of the transmitting device and the current through a second transmitter of the transmitting diode, in each case as a function of time, in the event of a change of the transmitter used for the data transmission "on the fly" according to the invention.

DETAILED DESCRIPTION OF THE INVENTION

FIG. 1 shows a device or a circuit arrangement 1 for operating an optical transmitting device 2. In the exemplary embodiment illustrated, the optical transmitting device 2 is embodied as a monolithic chip 20, on which a plurality, three in the exemplary embodiment illustrated of VCSEL laser diodes 21, 22, 23 are realized, which provide three optical output channels of the transmitting device 2. Furthermore, a monitor diode 24 is realized on the monolithic chip 20, said monitor diode converting detected light into current. Alternatively, other arrangements are contemplated by the present invention.

The device 1 for operating the transmitting device 2 has an output driver 11, a comparator 12, a control logic 13 and a memory 14. Although these components are illustrated separately in the illustration of the figure, they can be realized by one circuit. By way of example, the comparator 12 may be integrated in the control device 13, both being implemented for example by software that is processed by a microprocessor. In the simplest case, the comparator 12 and the control device 13 are realized by logic components or gates which are integrated in a driver component.

The output driver 11 serves for driving the three optical transmitters 21, 22, 23 of the transmitting device 2. In this case, the output driver 11 is formed in such a way that it can individually and selectively drive the laser diodes 21, 22, 23. This is effected via output control channels 11-1, 11-2, 11-3.

The comparator 12 has an input and an output. The input is connected to the monitor diode 24 of the transmitting device 2. The output is connected to the logic controller 13. The logic controller 13 is assigned the memory 14, to which the logic controller 13 can write values and from which it can read out stored values. The logic component 13 is furthermore connected via a control line 13-1 to the output driver 11 and can communicate to the latter, via the control line 13-1, control signals for driving the laser diodes 21, 22, 23.

The memory 14 is realized for example as a flip-flop or as a flash memory.

In one example the arrangement described functions as follows. From the three laser diodes 21, 22, 23, one is to be selected for data communication, while the other laser diodes are available as redundant laser diodes in the event of failure of the selected laser diode. For an intelligent selection of a suitable laser diode for the communication operation, a specific parameter representing a failure criterion is determined in the start phase of the system with respect to all of the laser diodes 21, 22, 23 present. In the exemplary embodiment illustrated, the light power of the laser diodes is determined as the parameter.

Another possible parameter is the operating temperature, for example. Suitable sensors for detecting the operating temperature are then integrated in the transmitting device. One possible parameter is furthermore the threshold value or threshold current of the laser diodes, that is to say the value at which a kink results in the PI characteristic curve.

In order to determine the light power, the laser diodes 21, 22, 23 are driven sequentially by the output driver 11 during the start phase. During the sequential driving, the photo diode 24 detects firstly the light emitted by the laser diode 21, then the light emitted by the laser diode 22, and then the light emitted by the laser diode 23. The light power values determined or current values of the monitor diode 24 that are equivalent thereto are compared with one another in the comparator 12 and the result of the comparison is communicated to the logic controller 13. In addition, the values determined are stored in the memory 14.

In order to determine the light power of the individual laser diodes 21, 22, 23, as an alternative it may also be provided that after operation of the first laser diode 21, the other two laser diodes are sequentially connected in, so that the monitor diode 24 detects firstly only the light of the laser diode 21, then the light of the laser diodes 21, 22, and then the light of all three laser diodes, 21, 22, 23. It is then possible to calculate back therefrom to the light power of the individual diodes, although this requires the monitor diode 24 to operate strictly linearly in the range under consideration. A further possibility for detecting the light power of the individual laser diodes 21, 22, 23 includes each laser diode being assigned a dedicated monitor diode (not illustrated).

As already mentioned, the comparator 12 compares the currents which are generated by the monitor diode 24 and correspond to the respective light powers of the photo diodes 21, 22, 23. The individual currents are compared with one another (either sequentially or else in parallel) in the comparator 12 and the logic controller selects that laser diode which has the highest light power or output power. The logic controller 13 then transmits, via the control line 13-1, a control command to the output driver 11 to select and correspondingly drive the laser diode having the highest light power for the communication operation.

At the same time, the determined current values or light power values of the individual laser diodes 21, 22, 23 are written to the memory 14.

The transmitting device 2 is then initially operated solely using the laser diode having the highest output power. By means of the monitor diode 24, which detects part of the emitted light, the present light power is continuously monitored during operation. If the present light power falls below a defined, prescribed value, a different laser diode is selected for the communication operation. This is effected by virtue of the logic component 13 reading out the values stored in the memory 14 and ascertaining which of the laser diodes has the second best light power value. This laser diode is then used for the further communication operation.

In this case, it may be provided that a "slow" change to the new transmitting source is effected by virtue of the light power with respect to the previously used transmitting source being reduced in a transmission time and simultaneously thereof, during the transmission time, the light power of the new transmitting source being increased up to a maximum value. This ensures that the communication operation functions without any errors during the changing of the laser diode used and the transmitted information is not disturbed.

A further advantage of the method described is that the probability of a changeover actually being necessary during the operating mode is very low. Thus, after the start phase and from the outset, the most suitable laser diode from among the laser diodes present is used for the communication operation.

Furthermore, the selection method described avoids inadvertent switching to an already greatly aged channel having a low light power, since the relative intensity of all the laser diodes is stored at the beginning of an operating phase and remains stored. As an alternative or in addition, this may also be prevented by means of a corresponding memory flag which inhibits the greatly aged channel.

The selection method described also prevents the situation in which a channel that is inadvertently deemed to be aged on account of unfavorable operating conditions during operation is permanently inhibited and no longer used for the data communication. This is because in the case of each restart of the system, the measuring and selecting method described is carried out anew, the values stored in the memory 14 being overwritten with the newly determined parameter values or values derived therefrom. Therefore, in the event of a restart of the system, a channel inadvertently deemed to be aged is again compared with the other channels under comparable conditions and a possible earlier incorrect appraisal is identified in the process.

For elucidating the method described, FIG. 2 shows as a function of time t the optical power $P_{OPT}$ of the transmitting device 2, the power supply $P_{EL}$ of the transmitting device 2 and the presence of data to be transmitted.

A start phase is given by the time interval $t_1$. This start phase $t_1$ is subdivided into a first phase $t_{11}$, in which the system is e.g. in the sleep mode. Beginning with the instant $T_1$, this is followed by a test phase $t_{test}$, which is followed e.g. by a further sleep phase $t_{12}$. The start phase ends after the time interval $t_1$ has elapsed at the instant $t_3$. At the instant $t_3$, a data transmission begins in accordance with the upper curve. During a time $t_2$, the optical power of the transmitter used in this case rises up to a maximum value. This rise time $t_2$ ends at the instant $t_4$. At times greater than $t_4$, a normal data transmission takes place.

In the test phase $t_{test}$, the individual laser diodes 21, 22, 23 are sequentially tested or supplied with current and the optical power is measured in the process. At the instant $T_2$, this is to say at the end of the test phase $t_{test}$, the optical powers detected are compared with one another and stored in the memory 14. The laser diode having the highest light power is then selected for the communication operation. The data transmission begins with the instant $T_3$, a normal data transmission being present starting from the instant $T_4$.

The power supply of the transmitting device 2 is increased in accordance with the middle curve during the test phase $t_{test}$ since the laser diodes are sequentially supplied with current in the test phase. If no data to be transmitted are present at the instant $t_2$, the system returns to the sleep mode again (cf. arrow A), until a data transmission begins after the time $t_{12}$ has elapsed. In this respect, the time $t_{11}+t_{test}$ may also be considered as a start phase.

FIG. 3 illustrates the described changing of the laser diodes used during a transition time, "on the fly". In accordance with the initial situation, data communication is effected using a first laser diode selected in accordance with the method described above. For this purpose, a first current $I_1$ flows through the selected laser diode. As the laser diode increasingly ages, it is necessary to realize a prescribed light power by means of an increasingly higher current. Accordingly, the current $I_1$ through the laser diode increases in the transition region B. If the required current reaches a limit value $I_{TH}$, then the control logic 13 identifies this as a criterion not to use this laser diode any further on account of its age, and instead to change over to a different laser diode. However, the changeover is preferably not effected abruptly, but rather during a transition time $t_3$. During this transition time $t_3$, the current through the previously used laser diode is continuously reduced in the region C. At the same time, the current $I_2$ through a replacement laser diode selected according to the method described is continuously increased in the region D up to a maximum value at the end of the transition time $t_3$. In this case, the optical power $P_{opt}$ has an essentially constant value X and is not associated with fluctuations or interruptions. A gentle change is effected "on the fly".

The configuration of the invention is not restricted to the exemplary embodiment illustrated above. By way of example, a different number of redundant laser diodes may be provided. Moreover, instead of VCSL laser diodes, it is possible to use other laser diodes or arbitrary other transmitting sources.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A method for operating an optical transmitting device having a plurality of optical transmitters that can be driven independently, comprising:
   detecting by a single monitor a parameter value of each of the plurality of optical transmitters;
   comparing the detected parameter values of all of the optical transmitters with one another or with a predetermined comparison value;
   selecting one of the transmitters for the communication operation of the transmitting device based on the comparison;
   operating the transmitting device with the selected transmitter.

2. The method of claim 1, further comprising:
   storing the detected parameter values in a memory;
   selecting a replacement transmitter from the plurality of transmitters based on the stored values when the transmitter currently being used for the communication operation deviates from a prescribed criterion; and
   using the newly selected transmitter for further communication operation.

3. The method of claim 2, wherein the transmitter used for the communication operation is changed by reducing the light conduction of the previously used transmitter and concurrently increasing the light power of the newly selected transmitter, wherein both transmitters emit light during a transition time.

4. The method of claim 2, wherein for the purpose of ascertaining a deviation of the transmitter currently being used for the communication operation from a prescribed criterion, the method comprises continuously monitoring the transmitter with regard to at least one parameter.

5. The method of claim 1, wherein the detecting, comparing and selecting actions are carried out in a start phase of the transmitting device.

6. The method of claim 5, wherein the detecting, comparing and selecting actions are repeated each start phase of the transmitting device.

7. The method of claim 6, wherein in each start phase, the parameter values stored in the memory are overwritten by the newly detected parameter values in the respective start phase.

8. The method of claim 1, wherein the detecting, comparing and selecting actions are carried out at the end of a production of the transmitting device, and further comprising storing the information regarding which of the transmitters is to be used initially for communication operation and the order in which further transmitters from among said transmitters are available as replacement transmitters in a non-volatile memory.

9. The method of claim 1, wherein the detected parameter comprises light power of the respective transmitter.

10. The method of claim 9, further comprising at least one light detector, wherein the light power of the transmitters is detected by the at least one light detector.

11. The method of claim 10, wherein detecting the light power comprises driving each of the transmitters sequentially and detecting at least part of the emitted light of each respectively driven transmitter.

12. The method of claim 1, further comprising setting an inhibit flag for a transmitter when the detected parameter value deviates from an ideal value by more than a prescribed tolerance value, wherein the set inhibit flag inhibits the corresponding transmitter for communication operation.

13. The method of claim 1, wherein the transmitters comprise lasers.

14. The method of claim 1, wherein the transmitting device comprises a monolithic chip on which a plurality of laser diodes that can be driven independently reside.

15. The method of claim 1, wherein the transmitter whose detected parameter value best fulfils a prescribed criterion is selected for the communication operation.

16. A device for operating an optical transmitting device comprising a plurality of optical transmitters that can be driven independently, comprising:
   an output driver configured to drive the optical transmitters independently of one another;
   a single monitor coupled to the plurality of optical transmitters for detecting a parameter value of each of the plurality of optical transmitters;
   a comparator configured to compare the detected parameter values associated with each of the plurality of optical transmitters with one another or with a reference value; and
   a control device coupled to the comparator and configured to pass control commands to the output driver to operate a specific one of the plurality of transmitters based on the comparator comparison.

17. The device of claim 16, further comprising a memory coupled to the control device, wherein the control device is configured to store the parameter values in the memory.

18. The device of claim 17, wherein the control device is further configured to identify a deviation of the transmitter currently being used for the communication operation from a prescribed criterion, and based on the values stored in the memory select a different one of the plurality of transmitters for the communication operation and transmit a control signal to the output driver to operate the selected transmitter.

19. The device of claim 18, wherein the control device is further configured to transmit control signals to the output driver to reduce the light power of the transmitter previously used for the communication operation down to zero during a transmitting time and to increase the light power on the selected transmitter to a maximum value during the transition time.

20. The device of claim 17, wherein the control device is further configured to update the memory with present parameter values or values derived therefrom during each start process of the device.

21. The device of claim 16, wherein the control device is configured, during each start process of the transmitting device, to transmit control signals to the output driver to sequentially drive the transmitters.

22. The device of claim 16, further comprising at least one light detector configured to detect light power of the transmitters, connected to the comparator.

* * * * *